(12) United States Patent
Parkhe (10) Patent No.: US 11,557,500 B2
(45) Date of Patent: Jan. 17, 2023

(54) HIGH TEMPERATURE HEATED SUPPORT PEDESTAL IN A DUAL LOAD LOCK CONFIGURATION

(71) Applicant: Applied Materials, Inc., Santa Clara, CA (US)

(72) Inventor: Vijay D. Parkhe, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 161 days.

(21) Appl. No.: 16/642,199

(22) PCT Filed: Sep. 19, 2018

(86) PCT No.: PCT/US2018/051751
§ 371 (c)(1),
(2) Date: Feb. 26, 2020

(87) PCT Pub. No.: WO2019/078989
PCT Pub. Date: Apr. 25, 2019

(65) Prior Publication Data
US 2020/0357679 A1    Nov. 12, 2020

Related U.S. Application Data

(60) Provisional application No. 62/572,938, filed on Oct. 16, 2017.

(51) Int. Cl.
*H01L 21/683* (2006.01)
*H05H 1/46* (2006.01)

(52) U.S. Cl.
CPC .......... *H01L 21/6838* (2013.01); *H05H 1/46* (2013.01)

(58) Field of Classification Search
CPC ..... B25B 11/00; B25B 11/005; B25B 11/007; B23Q 3/08; B23Q 3/088; H01L 21/6838; H01L 21/68785; H01L 21/68792; H01L 21/683; H01L 21/67103; H01L 21/67201; H05H 1/46
(Continued)

(56) References Cited

U.S. PATENT DOCUMENTS

2006/0245852 A1    11/2006    Iwabuchi
2013/0334199 A1*   12/2013    Yousif ............... H01L 21/67248
                                                          438/795
(Continued)

FOREIGN PATENT DOCUMENTS

JP        09213775 A  *  1/1996
JP       H09213775 A     8/1997
(Continued)

OTHER PUBLICATIONS

Machine Translation JP09213775A (Year: 1996).*
(Continued)

*Primary Examiner* — Lee D Wilson
*Assistant Examiner* — Alberto Saenz
(74) *Attorney, Agent, or Firm* — Patterson + Sheridan, LLP (57) ABSTRACT

Embodiments of the present disclosure provide a heated support pedestal including a body comprising a ceramic material, a support arm extending radially outward from a periphery of the body that is coupled to a shaft, and a vacuum conduit disposed within the shaft and through the body to connect with a surface of the body.

20 Claims, 10 Drawing Sheets

(58) Field of Classification Search
USPC .................................. 29/559; 269/20, 21, 35
See application file for complete search history.

(56) References Cited

U.S. PATENT DOCUMENTS

| | | |
|---|---|---|
| 2013/0337655 A1 | 12/2013 | Lee et al. |
| 2014/0263165 A1 | 9/2014 | Hongkham et al. |
| 2015/0380285 A1 | 12/2015 | Huseinovic et al. |

FOREIGN PATENT DOCUMENTS

| | | |
|---|---|---|
| JP | 2014509782 A | 4/2014 |
| KR | 10-2014-0012679 A | 2/2014 |
| KR | 20150038154 A | 4/2015 |
| WO | 2019078988 | 4/2019 |

OTHER PUBLICATIONS

International Search Report and Written Opinion for Application No. PCT/US2018/051751 dated Apr. 25, 2019.
Korean Notice of Allowance dated Oct. 18, 2021 for Application No. 10-2020-7011898.
Japanese Office Action in related application 2020-520554 dated Jul. 6, 2021.
Korean Office Action in related application KR 10-2020-7011898 dated Aug. 6, 2021.
Japanese Office Action in related application JP 2020-520554 dated Jul. 6, 2021.

\* cited by examiner

HIGH TEMPERATURE HEATED SUPPORT PEDESTAL IN A DUAL LOAD LOCK CONFIGURATION

BACKGROUND

Field

Embodiments of the present disclosure generally relate to load lock chamber including two chamber volumes and at least one chamber volume is configured for processing a substrate. More particularly, the present disclosure relates to a heated support pedestal for use in a dual load lock chamber.

Description of the Related Art

Ultra-large-scale integrated (ULSI) circuit devices may include more than one million electronic devices (e.g., transistors) that are formed on a semiconductor substrate, such as a silicon (Si) substrate, and which cooperate to perform various functions within the device.

Conventional electronic device manufacturing systems often include multiple process chambers and one or more load lock chambers surrounding, and connected to, a transfer chamber. These electronic device manufacturing systems employ a transfer robot housed within the transfer chamber, and which is adapted to transport substrates between the various process chambers and the load lock chambers.

In order to add additional processes desired for certain electronic devices (e.g., substrate) manufacture, or to add additional processes within a particular tool, a load lock chamber, e.g., a chamber disposed between, and selectively isolated from, the transfer chamber and a different environment, may be utilized to perform one or more processes on a substrate disposed therein. For example, the substrate may be heated while in the load lock chamber. Additionally, an etch process, for example a sputter etch cleaning process, may be performed on the substrate while in the load lock chamber.

However, typical support pedestals in current load lock chambers are fabricated from an aluminum material which limits the amount of heat that may be applied to the substrate located thereon. For example, the application of excessive heat will cause deformation of the support pedestal. Additionally, in certain etch processes, the support pedestal is reactive with some gases utilized in the etch process.

SUMMARY

Embodiments of the present disclosure provide a heated support pedestal including a body comprising a ceramic material, a support arm extending radially outward from a periphery of the body and coupled to a shaft, and a conduit disposed within the shaft and through the body to connect to a groove pattern formed in a surface of the body.

One embodiment of the present disclosure provides load lock chamber having a chamber body defining a first chamber volume and a second chamber volume isolated from the first chamber volume, and a heated support pedestal disposed in the second chamber volume. The heated support pedestal includes a body comprising a ceramic material, and a support arm extending radially outward from a periphery of the body that is coupled to a shaft. The load lock chamber also includes a remote plasma source connected to the second chamber volume for supplying a plasma to the second chamber volume.

Another embodiment of the present disclosure provides a load lock chamber having a chamber body defining a first chamber volume and a second chamber volume isolated from the first chamber volume, and a heated support pedestal disposed in the second chamber volume. The heated support pedestal comprises a body comprising a ceramic material, a support arm extending radially outward from a periphery of the body that is coupled to a shaft, and a vacuum conduit disposed within the shaft and through the body to connect with a groove pattern formed in a surface of the body. The load lock chamber also includes a remote plasma source connected to the second chamber volume for supplying a plasma to the second chamber volume.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation

DETAILED DESCRIPTION

Embodiments of the present disclosure generally relate to load lock chamber including two chamber volumes and at least one chamber volume is configured for processing a substrate. More particularly, to a heated support pedestal for use in a dual load lock chamber. Embodiments of the heated support pedestal include the capacity to heat a substrate disposed thereon to high temperatures up to and exceeding 550 degrees Celsius (C). "High temperature" may be defined herein as a temperature at or near the solidus temperature of aluminum, for example about 550 degrees C. to 600 degrees C. At these high temperatures, aluminum materials can deflect and/or distort. Embodiments of the present disclosure additionally relate to a dual load lock chamber including two isolated chamber volumes, wherein at least one chamber volume is configured for processing a substrate, for example, by exposing the substrate to reactive species of a gas, such as fluorine containing gases.

One embodiment of the present disclosure provides a load lock chamber having at least two isolated chamber volumes formed in a body assembly. The two isolated chamber volumes may be vertically stacked or disposed side-by-side. The two chamber volumes are independently operable to increase throughput. In one embodiment, a first chamber volume is configured to expose a substrate disposed therein to reactive species. The second chamber volume is utilized only to exchange the substrate between adjoining environments, such as between the environment of a factory interface and the environment of a transfer chamber.

One embodiment of the present disclosure provides a load lock chamber including a thin, heated, substrate support pedestal for heating the substrate therein and a showerhead disposed over the thin heated substrate support pedestal for uniformly supplying one or more processing gases to the substrate in the load lock chamber. In one embodiment, the showerhead is connected to a remote plasma source to supply reactive species to the load lock chamber through the showerhead.

Figure 1A:
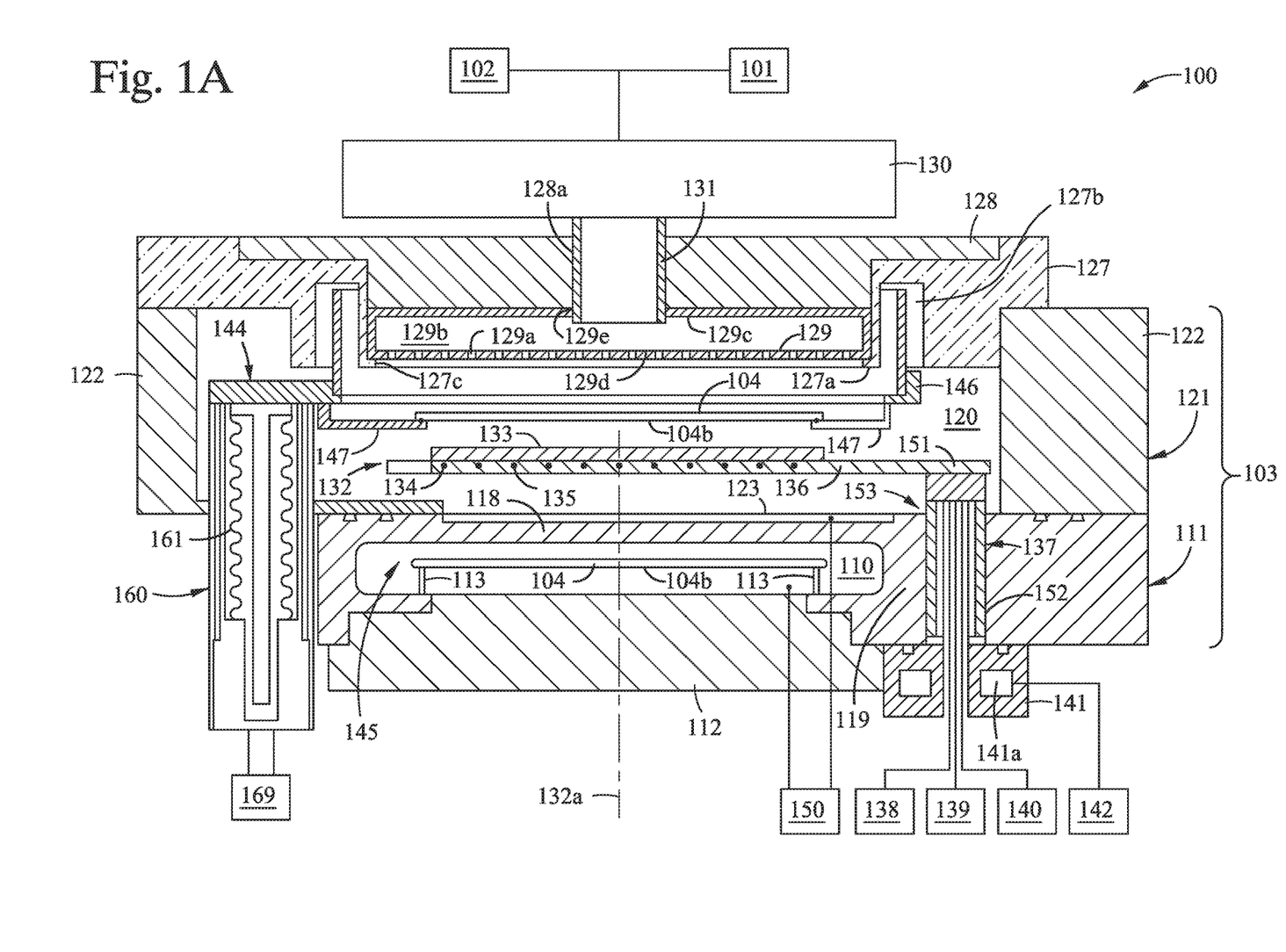
FIG. 1A is a schematic sectional view of a dual load lock chamber according to one embodiment of the present disclosure.

FIG. 1A is a schematic sectional view of a dual load lock chamber 100 according to one embodiment of the present disclosure. The dual load lock chamber 100 includes a first chamber volume 110 for transferring a substrate 104, and a second chamber volume 120 for transferring and processing a substrate 104. The second chamber volume 120 and the first chamber volume 110 are vertically stacked one over the other and are fluidly isolated from one another.

The dual load lock chamber 100 includes a chamber body assembly 103. In one embodiment, the chamber body assembly 103 includes a first chamber body 111 and a second chamber body 121 coupled together to define a unitary structure housing the first and second chamber volumes 120, 110. While the first chamber body 111 and the second chamber body 121 are vertically stacked, it is contemplated the first chamber body 111 and the second chamber body 121 may be positioned horizontally (e.g., side-by-side).

The first chamber volume 110 is defined by the first chamber body 111 and a chamber base 112 attached to the first chamber body 111. The first chamber body 111 has a top wall 118 and sidewalls 119. The top wall 118, side walls 119 and the chamber base 112 enclose the first chamber volume 110. A substrate support mechanism 145 in the first chamber volume 110, which is configured to support a substrate 104 and exchange a substrate with substrate transfer devices, such as substrate transfer robots, is disposed in the first chamber volume 110. In one embodiment, the substrate support mechanism 145 includes three or more supporting pins 113 for supporting a backside 104b of the substrate 104. In one embodiment, the supporting pins 113 are fixed to extend from the first chamber body 111 or the chamber base 112. The supporting pins 113 are positioned to interact with substrate transfer devices.

The second chamber volume 120 and the first chamber volume 110 are fluidly coupled to a vacuum system 150. In one embodiment, pressures in the second chamber volume 120 and the first chamber volume 110 are controlled independently from one another. Pressure(s) of about 4 Torr to about 12 Torr may be provided in one or both of the first chamber volume 110 and the second chamber volume 120.

The second chamber volume 120 of the dual load lock chamber 100 includes a showerhead 129, a heated support pedestal 132, and a lift hoop assembly 144. The showerhead 129 is disposed over the heated support pedestal 132. The lift hoop assembly 144 is configured to confine a processing environment within the second chamber volume 120.

The second chamber volume 120 is defined by sidewalls 122 of the second chamber body 121, a lid liner 127 disposed over the sidewalls 122, a bottom wall 123 of the second chamber body 121, and a top wall 118 of the first chamber body 111. The lid liner 127 has an inner lip 127a forming a central opening 127c. The inner lip 127a supports a showerhead 129 and a source adapter plate 128 thereover. The lid liner 127 also includes a cavity 127b that surrounds the showerhead 129. In one embodiment, the lid liner 127 is removably disposed over the second chamber body 121 to allow access to chamber components.

The showerhead 129 includes a face plate 129d having a plurality of through holes 129a formed therethrough and a back plate 129c having a central opening 129e. The face plate 129d and the back plate 129c enclose an inner volume 129b. The inner volume 129b serves as a plenum for enhancing the radial uniformity, across a substrate on the support pedestal 132, of gas provided into the second chamber volume 120 through the through holes 129a formed through the face plate 129d.

The source adapter plate 128 is disposed above the back plate 129c of the showerhead 129. The source adapter plate 128 has a central opening 128a aligns with the central opening 129e of the showerhead 129. A remote plasma source 130 is in fluid communication with the inner volume 129b of the showerhead 129 through a quartz insert 131 disposed in the openings 129e and 128a. Disassociated reactive species from the remote plasma source 130 enters the second chamber volume 120 by flowing through the quartz insert 131, the inner volume 129b of the showerhead 129, and then through the through holes 129a of the showerhead 129.

In one embodiment, the showerhead 129 is fabricated from quartz such that surfaces of the inner volume 129b exposed to the reactive species within the plenum are lined by quartz. The quartz insert 131 and the showerhead 129 shield metal chamber components from being exposed to the reactive species provided from the remote plasma source 130.

The remote plasma source 130 is generally connected to one or more gas panels for supplying one or more processing gas to the upper chamber volume 110 through the remote plasma source 130. In one embodiment, the remote plasma source 130 is connected to a first gas panel 101 configured for providing processing gases for an abatement process to remove residual material from the substrate after an etching process is performed thereon and a second gas panel 102 configured for providing processing gases for an ashing process to remove photoresist from the substrate. Fluorine containing gases may also be provided by the first gas panel 101 or the second gas panel 102.

The heated support pedestal 132 is configured to fit within the second chamber volume 120 of the dual load lock chamber 100. The heated support pedestal 132 is positioned and configured to be substantially thermally insulated from the chamber body assembly 103. In one embodiment, the heated support pedestal 132 is configured to heat the substrate 104 up to 550 degrees C., or greater, while the chamber body assembly 103 remains cool, or is actively cooled.

In one embodiment, the heated support pedestal 132 includes a heater 135. The heater 135 may be a resistive heating element or conduits arranged to flow a heat transfer fluid therethrough. The heated support pedestal 132 has a substrate receiving surface 133 that is configured to support the backside 104b of the substrate 104. The heated support pedestal 132 here includes a vacuum conduit 134 configured to vacuum chuck the backside 104b of the substrate during processing. While not shown, the heated support pedestal 132 may include an electrostatic puck to enable electrostatic chucking of the substrate 104 thereto during processing.

A support arm 151 extends radially outwardly form the body 136 of the heated support pedestal 132 and connects the body 136 to a shaft 137, such that the body 136 is cantilevered from the shaft. The shaft 137 extends through an opening 153 of the second chamber body 121 and an opening 152 of the first chamber body 111, and is sealed therewith by a seal (not shown). The shaft 137 provides a passageway for power supply cables, sensors and other wiring, as well as a vacuum line, for use in the heated support pedestal 132. In one embodiment, a heater power source 138, a sensor signal receiver 139 and a chucking control unit 140 disposed exteriorly of the chamber are coupled to the heated support pedestal 132 through the passage in the shaft 137. In one embodiment, the chucking control unit 140 is configured to control the vacuum pressure at the surface of the support pedestal to control the chucking force on a substrate thereon. In other embodiments, where an electrostatic puck is provided on the support pedestal 132, the chucking control unit 140 is a direct current power supply for providing an electrostatic chucking function to the heated support pedestal 132.

An adapter 141 is coupled to the shaft 137 and the first chamber body 111 from outside of the first chamber body 111. In some embodiments, the adapter 141 has cooling channels 141a formed therein. In the embodiments where the cooling channels 141a are utilized, a source 142 for cooling fluid is connected to the cooling channels 141a to provide a coolant to the adapter 141 and thereby prevent heat from passing therepast from the heated support pedestal 132.

In some embodiments, the body 136 of the heated support pedestal 132 as well as the shaft 137 is fabricated from a ceramic material while the adapter 141 is fabricated from an aluminum material.

The dual load lock chamber 100 also includes the lift hoop assembly 144 for transferring substrates between exterior robots and the heated support pedestal 132. The lift hoop assembly 144 includes a ring-shaped hoop body 146 disposed within the second chamber volume 120 around the heated support pedestal 132. The hoop body 146 is coupled to a lift mechanism 160 disposed in an outer region of the second chamber volume 120. The lift mechanism 160 moves the hoop body 146 vertically within the second chamber volume 120. In one embodiment, the lift mechanism 160 includes a bellows 161 that maintains pressure during vertical movement thereof. The lift mechanism 160 may be coupled to a motorized actuator 169 disposed outside the chamber body assembly 103.

Three or more lift fingers 147 are attached to the hoop body 146. The lift fingers 147 extend vertically downwardly and radially inwardly from the hoop body 146. The lift fingers 147 are configured to transfer substrates between the heated support pedestal 132 and substrate transfer devices, such as robots, which access the second chamber volume 120 from the exterior of the second chamber volume 120. FIG. 1A shows the lift hoop assembly 144 in an upper position for substrate exchange with an exterior substrate transfer device, such as a robot.

Figure 1B:
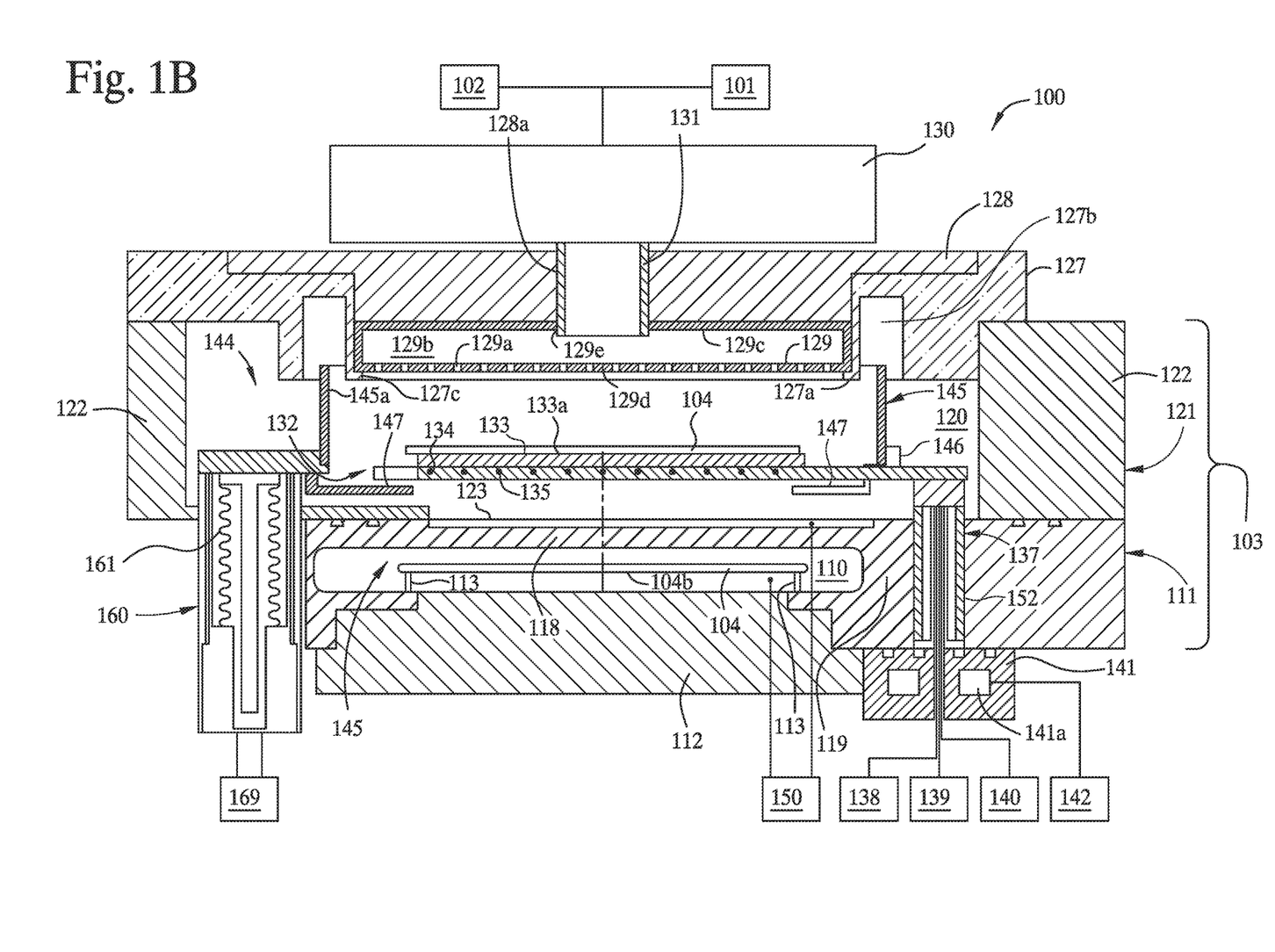
FIG. 1B is a schematic sectional view of the dual load lock chamber of FIG. 1A during processing.

FIG. 1B is a schematic sectional view of the dual load lock chamber 100 the lift hoop assembly 144 in a lower position for substrate processing. When the hoop body 146 is at a lower position shown in FIG. 1B, the lifting fingers 147 are positioned below the upper surface 133a of the upper heater plate 133. As the hoop body 146 rises to the upper position, the lifting fingers 147 move to contact with and lift the substrate 104 from the heated substrate support assembly 132. While the hoop body 146 is at the upper position shown in FIG. 1A, external substrate transferring device (not shown) can enter the second chamber volume 120 through one of the ports to remove the substrate 104 from the lifting fingers 147 and subsequently place a new substrate 104 onto the lifting fingers 147. When the hoop body 146 lowers to the lower position again, the new substrate 104 positioned on the lifting fingers 147 is placed on the heated substrate support assembly 132 for processing.

A hoop liner 145 is attached to the hoop body 146. The hoop liner 145 extends vertically upwards from the hoop body 146. In one embodiment, the hoop liner 145 is a ring having a substantially flat cylindrical inner wall 145a. In one embodiment, the height 145b of the inner wall 145a of the hoop liner 145 is much greater than the thickness of the heated substrate support assembly 132 and an inner diameter greater than the outer diameters of the heated substrate support assembly 132 and the showerhead 129 so that the hoop liner 145 can create a processing environment around the heated substrate support assembly 132 and the showerhead 129. When the hoop body 146 is in the upper position, shown in FIG. 1A, the hoop liner 145 may enter into the cavity 127b formed within the lid liner 127. When the hoop body 146 is in the lower position, the cylindrical inner wall 145a of the hoop liner 145 creates a circular confinement wall within the second chamber volume 120 around the substrate 104 and the region immediately above the heated substrate support assembly 132, therefore, providing a symmetrical processing environment for the substrate 104. The height of the hoop liner 145 is sufficiently large enough to cover the vertical space between the face plate 129d of the showerhead 129 and the heated substrate support assembly 132. In one embodiment, the hoop liner 145 is made of quartz.

Figure 2:
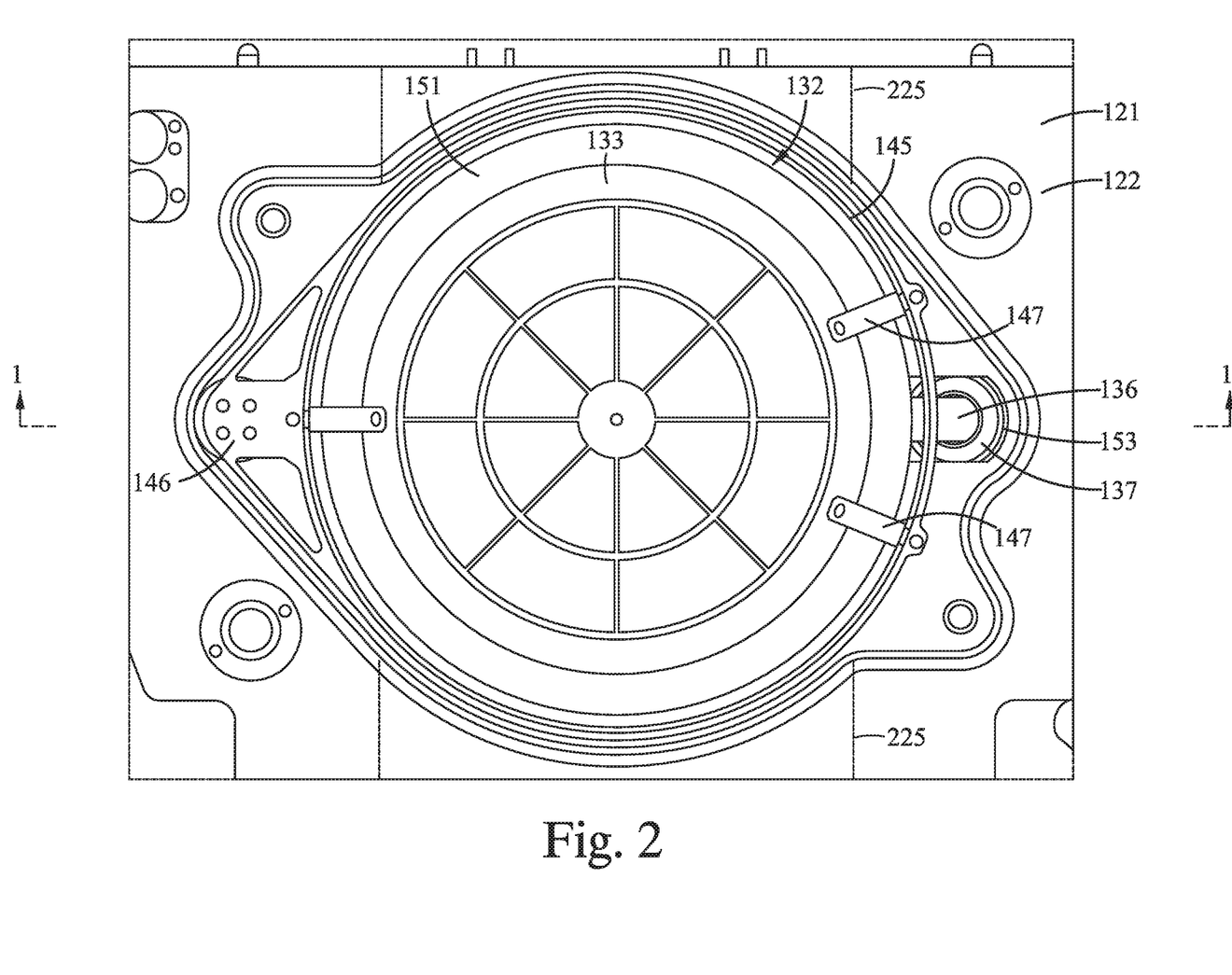
FIG. 2 is a schematic top view of the second chamber body of FIG. 1A.

FIG. 2 is a schematic top view of a second chamber body 121 with the showerhead 129 removed. Two openings 225 are formed through the sidewalls 122 to allow substrate transfer into and from the interior of the second chamber body 121. A slit valve door may be provided outside of each opening 225 to selectively open access into the interior of the second chamber body and thus provide an interface between the outside environment and the second chamber volume.

Figure 3:
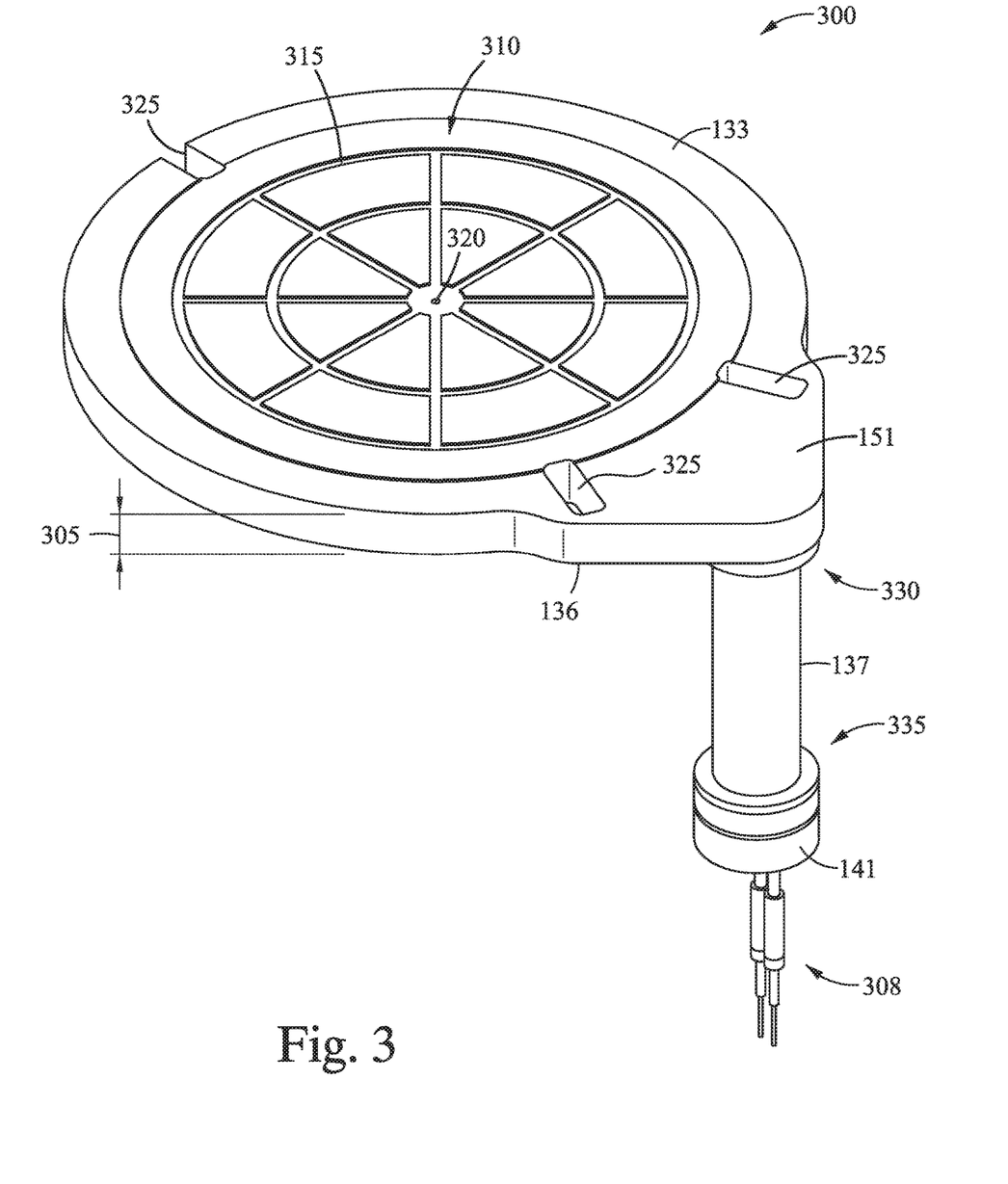
FIG. 3 is a perspective view of one embodiment of a heated support pedestal assembly that may be utilized with the load lock chamber of FIG. 1A.

FIG. 3 is a perspective view of one embodiment of a heated support pedestal assembly 300 here used as the heated support pedestal 132 shown in FIGS. 1A, 1B and 2. The heated support pedestal assembly 300 according to this embodiment includes the shaft 137 and the adapter 141. Connections 308 for coupling to the heater power source 138, the sensor signal receiver 139 and the chucking control unit 140 (shown in FIGS. 1A and 1B) extend from the adapter 141.

In some embodiments, the body 136 of the heated support pedestal assembly 300 has a thickness 305 of about 10 mm to about 18 mm, such as between about 12 mm and about 16 mm. The central portion of an upper surface (or substrate receiving surface) 310 of the body 136 includes a groove pattern 315, here comprising two concentric circular grooves, eight radial grooves equally spaced about 45 degrees apart extending between, and in communication with, the circular grooves, and a central recess (FIG. 3). The groove pattern 315 is fluidly coupled to a center vacuum passage 320 generally centered in the central recess which is fluidly coupled to the chucking control unit 140 as shown and described in FIGS. 1A and 1B. A plurality of slots 325 are formed in the body 136 and they allow the lift fingers 147 of the lift hoop assembly 144 to pass thereinto to facilitate substrate transfer from the lift fingers 147 to the upper surface of the body 136. In an embodiment, the body 136 is coupled to the shaft 137 by diffusion bonding therebetween (diffusion bond) 330, or other suitable ceramic-to-ceramic bonding method. The shaft 137 may be coupled to the adapter 141 utilizing a fastener connection 335, such as screws or bolts.

Figure 4:
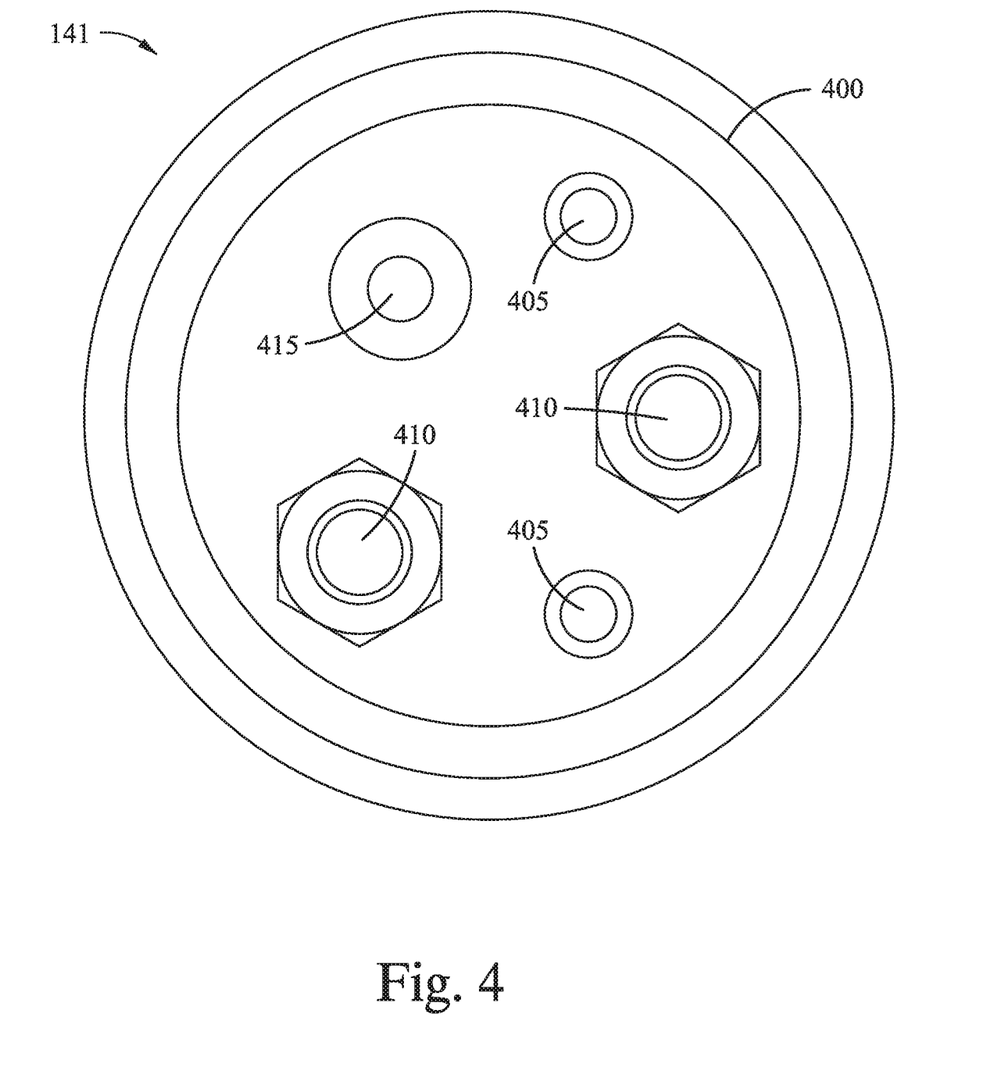
FIG. 4 is a bottom plan view of the adaptor of FIG. 3.

FIG. 4 is a bottom plan view of the adapter 141 of FIG. 3. The adapter 141 includes a body 400 that here is fabricated from aluminum. The body 400 includes terminals 405 for electrical leads that couple to the heater 135 and the heater power source 138 shown in FIGS. 1A and 1B. The body 400 also includes openings 410 for temperature probes, and an opening 415 that couples to the center vacuum passage 320 (shown in FIG. 3) and the chucking control unit 140 (shown in FIGS. 1A and 1B).

Figure 5:
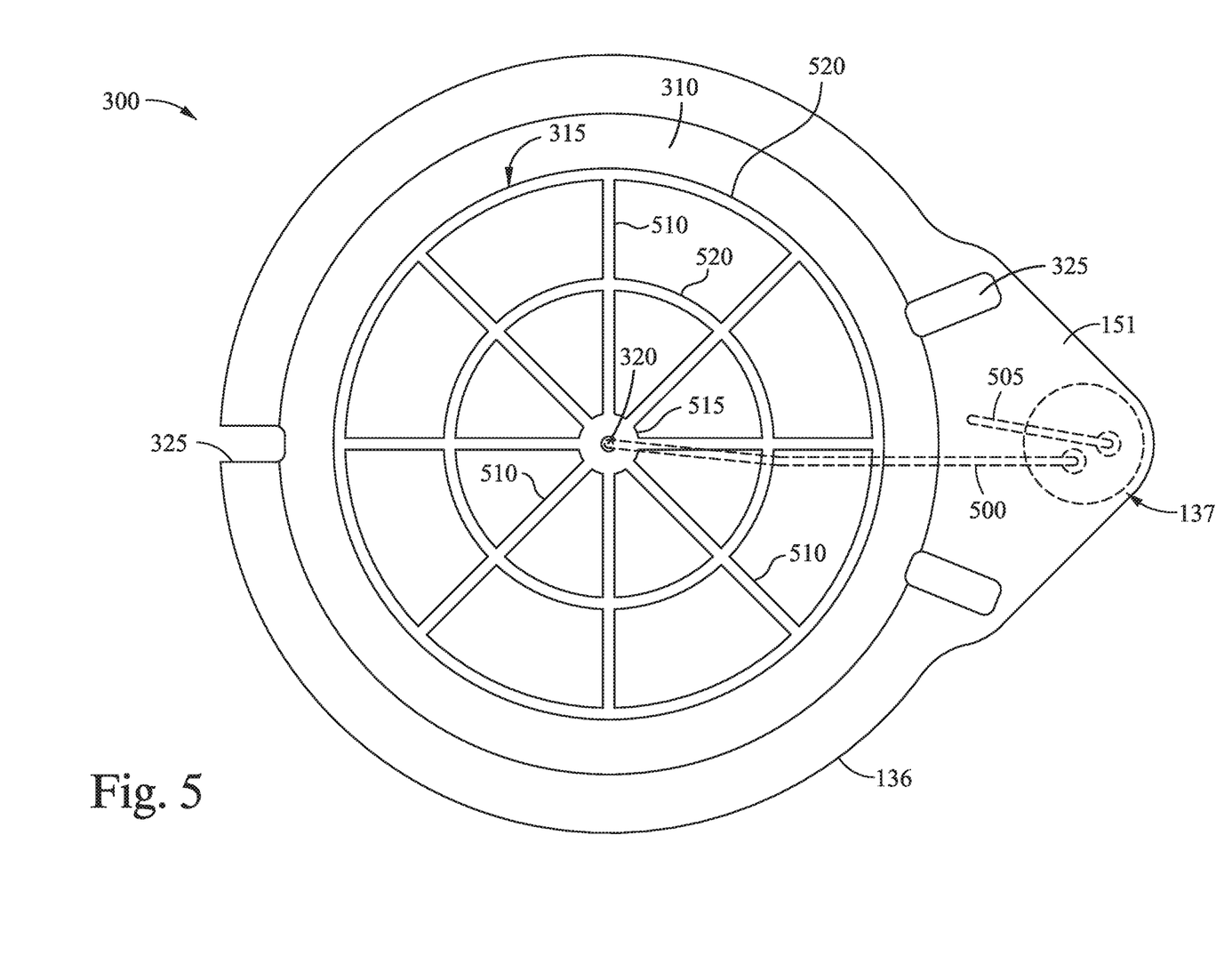
FIG. 5 is a schematic plan view of the heated support pedestal assembly showing the groove pattern and the center vacuum passage.

FIG. 5 is a schematic plan view of the heated support pedestal assembly 300 showing the groove pattern 315 and the center vacuum passage 320. Conduits 500 and 505 (shown in phantom) below the upper surface 310 of the body 136 provide fluid paths within the heated support pedestal assembly 300. The conduit 500 provides a vacuum passage extending between the shaft 137 and the center vacuum passage 320. The conduit 505 is provided to house a temperature probe such as a thermocouple, an infrared temperature sensor, or another temperature sensing apparatus. The groove pattern 315 according to this embodiment includes a plurality of radially oriented grooves 510 extending outwardly from a central groove 515. The radially oriented grooves 510 intersect with one or more circular grooves 520.

Figure 6:
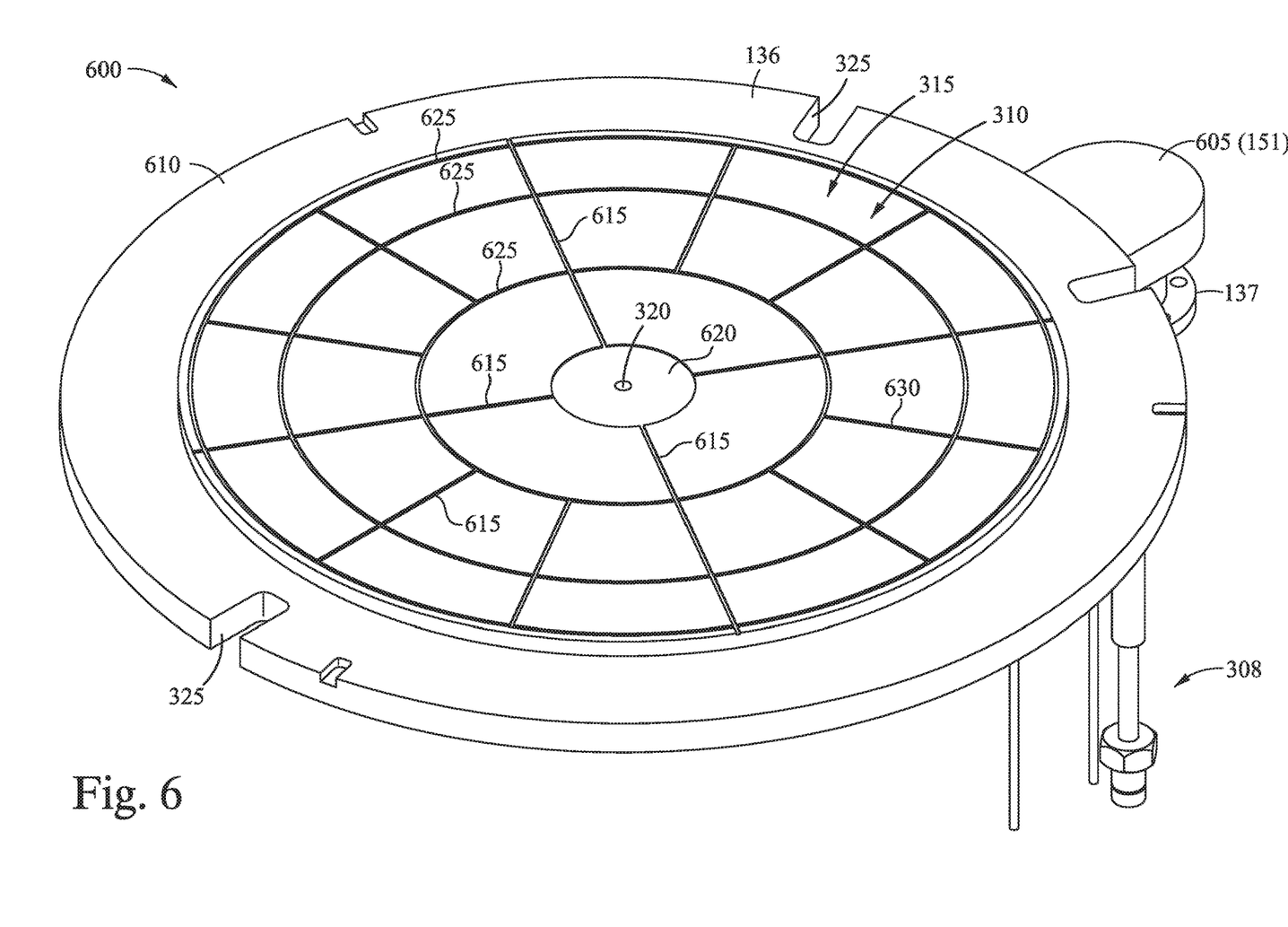
FIG. 6 is a perspective view of another embodiment of a heated support pedestal assembly that may be utilized with the load lock chamber of FIG. 1A.

FIG. 6 is a perspective view of another embodiment of a heated support pedestal assembly 600 that may be utilized as the heated support pedestal 132 shown in FIGS. 1A, 1B and 2. The heated support pedestal assembly 600 includes the shaft 137 and a metallic support arm 605 that extends between the body 136 and the shaft 137. Connections 308 for coupling to the heater power source 138, the sensor signal receiver 139 and the chucking control unit 140 (shown in FIGS. 1A and 1B) extend from the shaft 137.

In this embodiment, the body 136 includes a recessed upper, outer surface 610 surrounding the upper surface (e.g., the substrate receiving surface) 310. The outer surface 610 may be recessed from a plane of the upper surface 310 by about 4 mils (about 0.102 millimeters) to about 20 mils (about 0.508 millimeters), such as about 6 mils (about 0.1524 millimeters) to about 10 mils (about 0.254 millimeters). In one embodiment, the upper surface 310 is sized to be smaller than a diameter of a substrate to be placed thereon such that the substrate overhangs the upper surface 310 and overlies a portion of the outer surface 610. Additionally, the substrate may at least partially overlie an inner portion of each of a plurality of slots 325. The plurality of slots 325 are formed in the body 136 and may be utilized to allow the lift fingers 147 of the lift hoop assembly 144 to pass therethrough to facilitate substrate transfer, which overlies a portion of the slots 325. The center vacuum passage 320 and the groove pattern 315 are shown on the upper surface 310 of the body 136. The groove pattern 315 according to this embodiment includes a plurality of first radially oriented grooves 615 extending outwardly from a central groove 620. The first radially oriented grooves 615 intersect with one or more circular grooves 625. Additionally, the groove pattern 315 includes a plurality of second radially oriented grooves 630 that extend radially outward from one of the circular grooves 625.

In one embodiment, the overhang of a substrate (not shown) from the upper surface 310 (and/or overlying the outer surface 610) allows gas flow between the outer surface 610 and a lower surface of the substrate. This gas flow facilitates temperature uniformity and thus enhances uniformity of film removal from the substrate.

Figure 7:
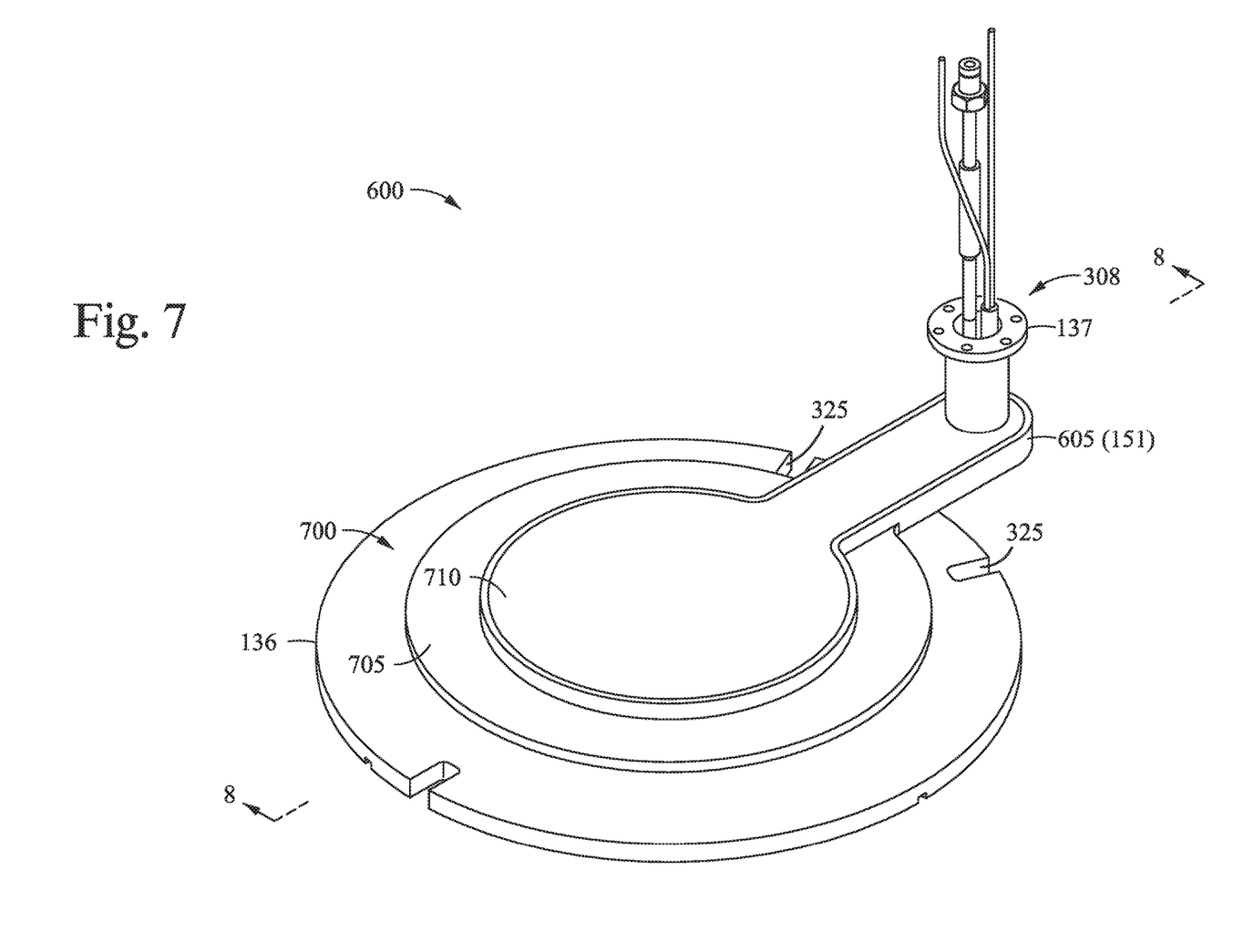
FIG. 7 is a perspective view showing a bottom of the heated support pedestal assembly of FIG. 6.
Figure 8:
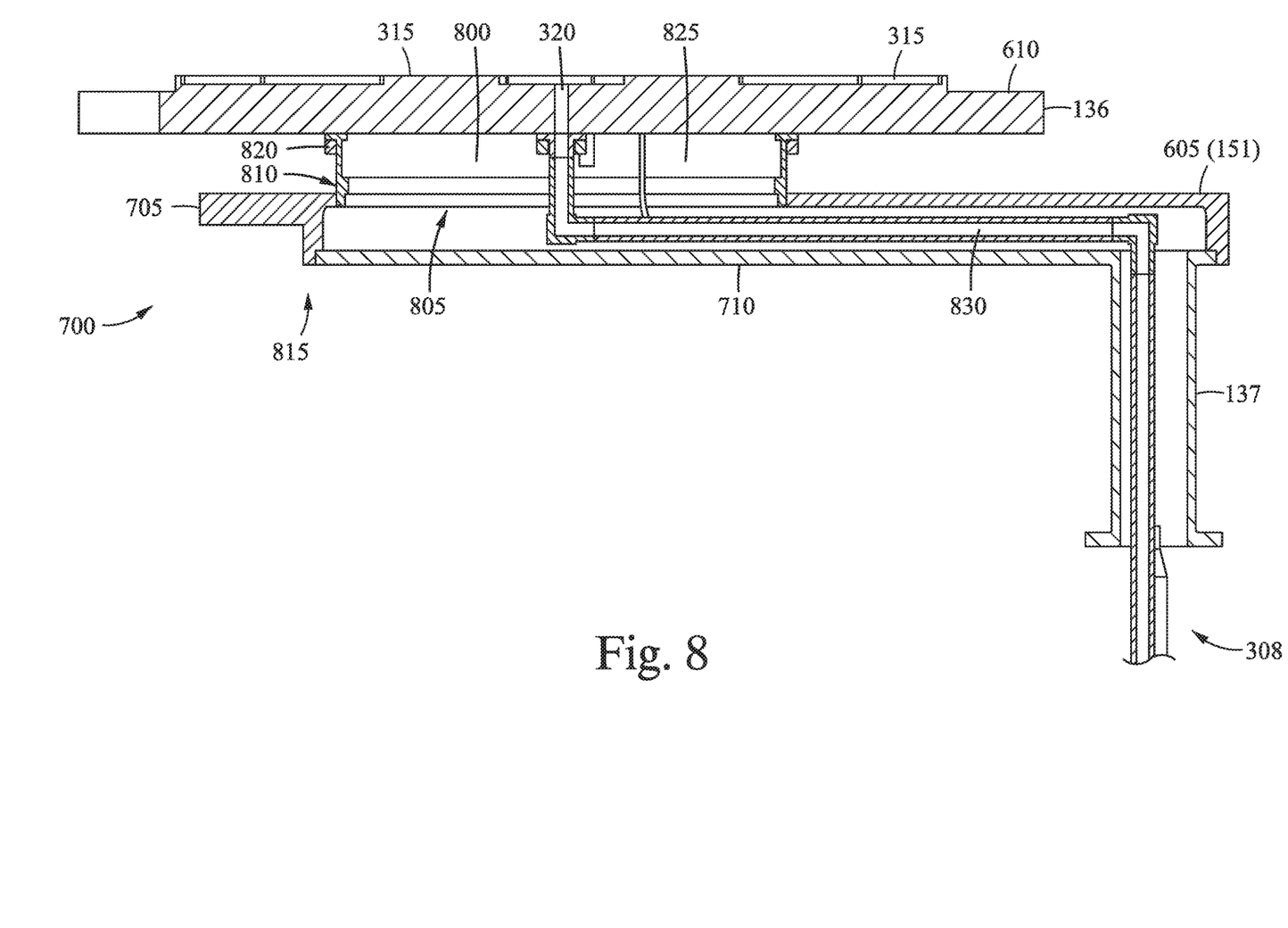
FIG. 8 is a side view of the heated support pedestal assembly along lines 8-8 of FIG. 7.
Figure 9:
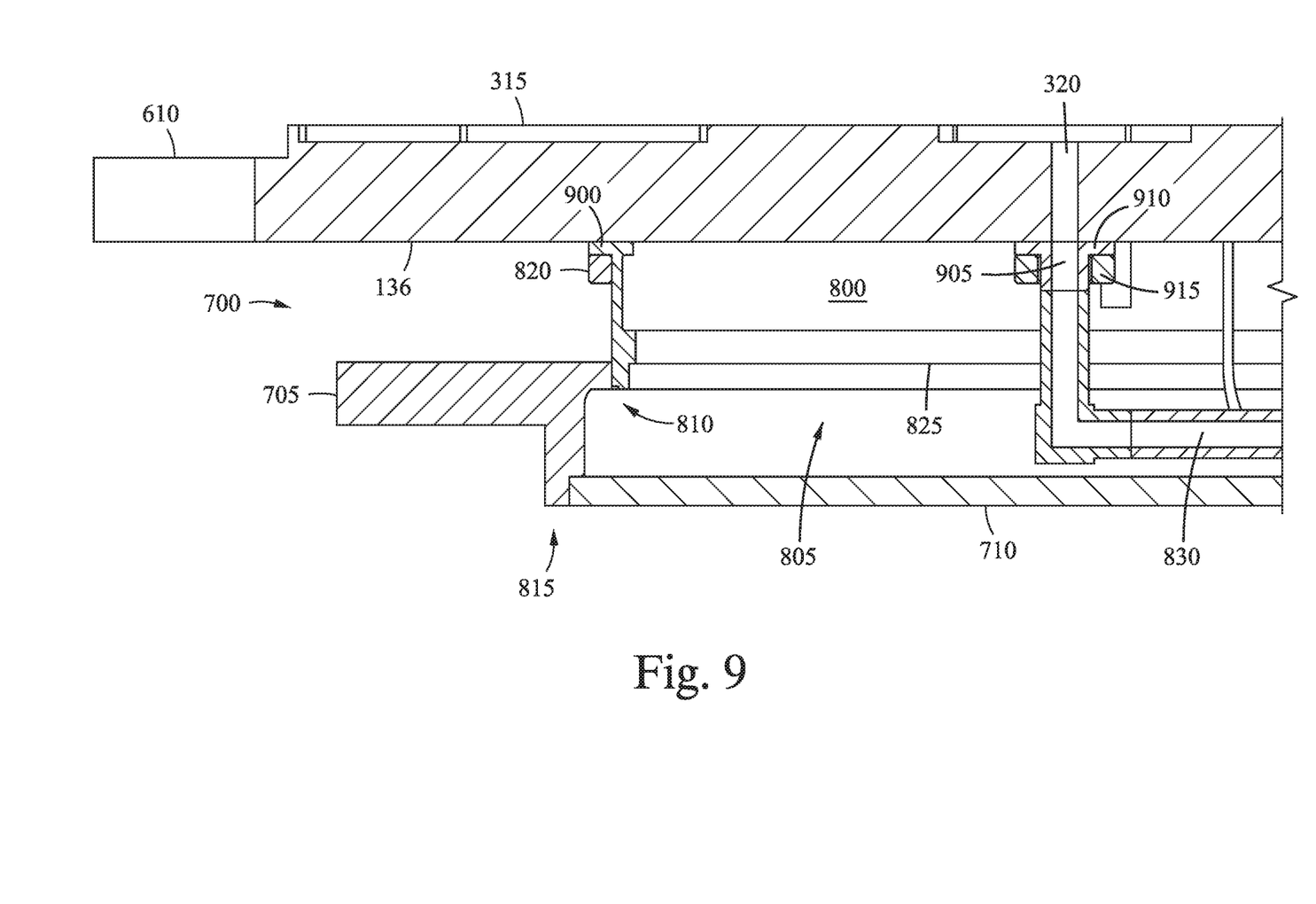
FIG. 9 is an enlarged cross-sectional view of the side view of FIG. 8.

FIG. 7 is a perspective view showing a bottom of the heated support pedestal assembly 600 of FIG. 6. FIG. 8 is a side view of the heated support pedestal assembly 600 along lines 8-8 of FIG. 7. FIG. 9 is an enlarged cross-sectional view of the side view of FIG. 8.

In one embodiment, the metallic support arm 605 comprises a cantilevered support assembly 700 fixed between the body 136 and the shaft 137. The support assembly 700 includes a ring-shaped member 705 that is covered by a paddle-shaped plate 710.

As shown in FIGS. 8 and 9, the support assembly 700 is coupled to the body 136 by an annular spacer 800. In particular, the annular spacer 800 is received in an opening 805 formed in the ring-shaped member 705. In some embodiments, the ring-shaped member 705, the annular spacer 800, and the paddle-shaped plate 710 may be fabricated from a metallic material, such a stainless steel, or an iron/nickel/cobalt alloy, for example a material marketed as KOVAR® available from Carpenter Technology Corporation of Philadelphia, Pa. An interface 810 between the ring-shaped member 705 and the annular spacer 800 as well as an interface between the paddle-shaped plate 710 and the ring-shaped member 705 may be welded, such as by electron beam welding, or other suitable metal joining process.

The annular spacer 800 includes a flange 900 (shown in FIG. 9) that here is brazed to the ceramic material of the body 136. A first ceramic ring 820 is positioned about the periphery of the annular spacer 800 which strengthens the interface between the annular spacer 800 and the body 136. The first ceramic ring 820 is brazed to a lower surface of the flange 900, a lower surface of the body 136, and/or a sidewall of the annular spacer 800. A sealed volume 825 is formed within the ring-shaped member 705 and the annular spacer 800 when coupled with the paddle-shaped plate 710 and the body 136, respectively. A conduit 830 is provided through the sealed volume 825 in order to connect the center vacuum passage 320 to the chucking control unit 140 as shown and described in FIGS. 1A and 1B. A tubular conduit 905 (shown in FIG. 9) is positioned between the lower surface of the body 136 and the conduit 830. The tubular conduit 905 is fabricated from a metallic material, such a stainless steel, or an iron/nickel/cobalt alloy as described above. The tubular conduit 905 includes an outwardly extending flange 910 that is brazed to the body 136. Additionally, a second ceramic ring 915 is positioned about the periphery of the tubular conduit 905 which strengthens the interface between the tubular conduit 905 and the body 136. The second ceramic ring 915 may be brazed to a lower surface of the flange 910, a lower surface of the body 136, and/or a sidewall of the tubular conduit 905.

While the foregoing is directed to embodiments of the present disclosure, other and further embodiments of the disclosure may be devised without departing from the basic scope thereof, and the scope thereof is determined by the claims that follow.

What is claimed is:

1. A heated support pedestal, comprising:
a body comprising a ceramic material;
an off axis shaft coupled to the body by a support arm;
a support assembly comprising a ring-shaped member and a paddle-shaped plate attached to the ring-shaped member, coupled to the body by an annular spacer wherein the annular spacer is coupled to the ring-shaped member of the support assembly;
a ceramic ring positioned around the periphery of the annular spacer; and
a vacuum conduit disposed within the shaft and through the body and the support arm to connect with a surface of the support assembly at a vacuum passage formed in a center of the support assembly.

2. The support pedestal of claim 1, wherein the body includes a plurality of slots formed therein, and each of the slots are aligned along a radially inward direction from a periphery of the body.

3. The support pedestal of claim 1, wherein the body includes a channel for a temperature probe.

4. The support pedestal of claim 1, wherein an adapter is coupled to the shaft.

5. The support pedestal of claim 4, wherein the adapter comprises an aluminum material.

6. The support pedestal of claim 1, wherein the support arm comprises a metallic material.

7. The support pedestal of claim 1, wherein the ceramic ring is positioned about the periphery of the annular spacer.

8. The support pedestal of claim 7, wherein the annular spacer is coupled to the ring-shaped member.

9. The support pedestal of claim 8, wherein the paddle-shaped plate is coupled to the ring-shaped member to form a sealed volume bounded by the ring-shaped member and the annular spacer and between the body and the paddle-shaped plate.

10. A load lock chamber, comprising:
a chamber body defining a first chamber volume and a second chamber volume isolated from the first chamber volume;
a heated support pedestal disposed in the second chamber volume, wherein the heated support pedestal comprises:
a body comprising a ceramic material;
a support arm extending radially outward from a periphery of the body that is coupled to a shaft;
a support assembly coupled to the body by an annular spacer;
a ceramic ring positioned around the annular spacer;
a ring shaped member coupled to the annular spacer;
a paddle-shaped plate is coupled to the ring-shaped member; and
a vacuum conduit disposed within the shaft and through the body at a vacuum passage formed in a center of the body to connect with a groove pattern formed in a surface of the body; and
a remote plasma source connected to the second chamber volume for supplying a plasma to the second chamber volume.

11. The load lock chamber of claim 10, wherein the heated support pedestal further comprises an adapter coupled to the shaft.

12. The load lock chamber of claim 11, wherein the adapter comprises an aluminum material.

13. The load lock chamber of claim 10, wherein the heated support pedestal further includes a channel for a temperature probe.

14. The load lock chamber of claim 10, wherein the heated support pedestal further includes a plurality of slots formed therein, and each of the slots are aligned along a radially inward direction from a periphery of the body.

15. A heated support pedestal, comprising:
a body comprising a ceramic material;
a support arm coupled to the body by an annular spacer, the support arm extending radially outward from a periphery of the body that is coupled to an off axis shaft that is coupled to the support arm;
a support assembly coupled to the body wherein the support assembly comprises a ring-shaped member and a paddle-shaped plate attached to the ring-shaped member, coupled to the body by an annular spacer wherein the annular spacer is coupled to the ring-shaped member of the support assembly;
a ceramic ring positioned around the periphery of the annular spacer; and
a vacuum conduit disposed within the shaft and through the body and the support arm to connect with a surface of the body, wherein the body includes a channel for a temperature probe.

16. The heated support pedestal of claim 15, further comprising an adapter coupled to the shaft.

17. The heated support pedestal of claim 16, wherein the adapter comprises an aluminum material.

18. The heated support pedestal of claim 15, wherein the body of the heated support pedestal further includes a channel for a temperature probe.

19. The heated support pedestal of claim 15, wherein the body includes a plurality of slots formed therein.

20. The heated support pedestal of claim 19, wherein each of the slots are aligned along a radially inward direction from a periphery of the body.

* * * * *